(12) United States Patent
Saito et al.

(10) Patent No.: US 6,562,186 B1
(45) Date of Patent: May 13, 2003

(54) APPARATUS FOR PLASMA PROCESSING (75) Inventors: Susumu Saito, Kofu (JP); Norikazu Sugiyama, Higashiyatsushiro-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/784,453

(22) PCT Filed: Aug. 6, 1999

(86) PCT No.: PCT/JP99/04283

§ 371 (c)(1),
(2), (4) Date: Feb. 27, 2001

(87) PCT Pub. No.: WO00/13219

PCT Pub. Date: Mar. 9, 2000

(30) Foreign Application Priority Data

Aug. 31, 1998 (JP) .......................................... 10-260865

(51) Int. Cl.[7] .......................... H05H 1/00; C23C 16/00; C23C 14/00

(52) U.S. Cl. ........................... 156/345.24; 156/345.25; 118/712; 118/715; 204/298.32; 204/192.33

(58) Field of Search ...................... 156/345.24, 345.25, 156/345.34, 345.47; 118/712, 715, 713, 723 E; 356/124; 348/86, 79, 87; 204/298.32, 192.33

(56) References Cited

U.S. PATENT DOCUMENTS

| | | | | |
|---|---|---|---|---|
| 5,157,465 A | * | 10/1992 | Kronberg | 356/405 |
| 5,231,464 A | * | 7/1993 | Ichimura et al. | 356/477 |
| 5,759,424 A | * | 6/1998 | Imatake et al. | 216/60 |
| 6,042,650 A | * | 3/2000 | Uesugi et al. | 118/712 |
| 6,055,927 A | * | 5/2000 | Shang et al. | 118/723 ME |
| 6,176,933 B1 | * | 1/2001 | Yang | 118/722 |
| 6,320,652 B1 | * | 11/2001 | Morimot et al. | 356/124 |

FOREIGN PATENT DOCUMENTS

| | | | | |
|---|---|---|---|---|
| JP | 8-78393 A | * | 3/1996 | ....... H01L/21/3065 |
| JP | 8-106992 | | 4/1996 | |
| JP | 9-129617 | | 5/1997 | |
| JP | 9-330917 | | 12/1997 | |

* cited by examiner

*Primary Examiner*—Parviz Hassanzadeh
(74) *Attorney, Agent, or Firm*—Oblon, Spivak, McClelland, Maier & Neustadt, P.C.

(57) ABSTRACT

A plasma etching apparatus for a semiconductor wafer generates plasma in a plasma generation space between a susceptor and a showerhead. A shield member is detachably disposed inside the sidewall of a process chamber to prevent reaction products from sticking to the sidewall. A window device is arranged to lead plasma light emitted from plasma out of the process chamber. The window device includes a quartz window plate airtightly attached to the sidewall of the process chamber. The window device also includes an aluminum light guide having a number of capillary through holes for guiding the plasma light to the window plate, and a sapphire cover plate disposed between the window plate and the light guide and covering the openings of the through holes. The light guide and the cover plate are attached to the shield member.

15 Claims, 4 Drawing Sheets

APPARATUS FOR PLASMA PROCESSING

TECHNICAL FIELD

The present invention relates to a plasma processing apparatus for a semiconductor processing system, and specifically to an improvement of a window device used for leading plasma light emitted from plasma out of a process chamber. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

BACKGROUND ART

Conventionally, in the processes of manufacturing semiconductor devices, plasma processes, such as dry etching and plasma CVD (Chemical Vapor Deposition) are frequently utilized. A plasma processing apparatus generally used for performing such plasma processes includes an airtight process chamber in which an upper electrode and a lower electrode are disposed to face each other. According to this apparatus, a semiconductor wafer or target substrate is placed on the lower electrode, a predetermined process gas is supplied into the process chamber, and then a predetermined radio frequency (RF) power is applied to, e.g., the lower electrode. By doing so, plasma is generated in the process chamber, and is used to subject the semiconductor wafer to a predetermined plasma process.

In this kind of plasma processing apparatus, the end point of a plasma process, such as an etching process, is detected on the basis of a change in an emission spectrum of plasma excited in the process chamber, as follows. Specifically, first, the emission spectrum is transmitted from the process chamber into the light receiving portion of an end point detector disposed outside the process chamber, through a detection window for the plasma light. The detection window is made of, e.g., quartz, and formed in the sidewall of the process chamber at a position on the detection light passageway for the emission spectrum. Then, on the basis of a change in the emission spectrum thus transmitted, the end point of the etching process is detected by the end point detector.

However, during the process, adhesive matters, such as reaction products, are produced in the process chamber and stick to the surface of the detection window inside the process chamber. As a result, transmittance of the plasma light is lowered, so the end point of the etching process becomes gradually more difficult to detect. Accordingly, the detection window requires frequent cleaning or replacement, which is problematic.

Conventionally, in order to solve this problem, there is a proposed technique in that the surface of the detection window inside the process chamber is provided with blind holes having a diameter of, e.g., about 8 mm, to enlarge the surface area of a portion near the detection window (Jpn. Pat. Appln. KOKAI Publication No. 9-330917). This technique is intended to utilize the surface area enlarged by the blind holes to decrease the amount of reaction products sticking to the detection window per unit of processing time, so that timing for cleaning or replacement of the detection window can be postponed.

However, since the detection window provided with the blind holes is made of quartz, the quartz is easily etched and dimmed by plasma and thus decreases the amount of transmitted light.

DISCLOSURE OF THE INVENTION

The present invention has been made in consideration of the above-described problem, and an object of the present invention is to provide a plasma processing apparatus for a semiconductor processing system in which the surface of a detection window is protected from sticking matter, such as reaction products, and is scarcely etched by plasma, so that the state of the plasma can be precisely detected for a long period of time.

According to a first aspect of the present invention, there is provided a plasma processing apparatus for a semiconductor processing system, comprising:

a process chamber enveloping a plasma generation space for generating plasma;

an exhaust mechanism configured to exhaust the process chamber and set the process chamber at a vacuum;

a process gas supply mechanism configured to supply a process gas into the process chamber;

an exciting mechanism configured to excite the process gas and turn the gas into plasma in the plasma generation space; and a window device configured to lead plasma light emitted from the plasma out of the process chamber, wherein the window device comprises a window plate airtightly attached to a sidewall of the process chamber and being transmissible for the plasma light, a light guide disposed between the window plate and the plasma generation space and having a number of capillary through holes configured to guide the plasma light to the window plate, the through holes having respective inner openings facing the plasma generation space and respective outer openings facing the window plate, the light guide having a resistance against the plasma higher than the window plate and being not transmissible for the plasma light except the through holes, and a cover plate disposed between the window plate and the light guide and covering the outer openings of the through holes, the cover plate having a resistance against the plasma higher than the window plate and being transmissible for the plasma light.

According to a second aspect of the present invention, there is provided a plasma processing apparatus for a semiconductor processing system, comprising:

a process chamber enveloping a plasma generation space for generating plasma;

an exhaust mechanism configured to exhaust the process chamber and set the process chamber at a vacuum;

a process gas supply mechanism configured to supply a process gas into the process chamber;

an exciting mechanism configured to excite the process gas and turn the gas into plasma in the plasma generation space;

a shield member detachably disposed between a sidewall of the process chamber and the plasma generation space, and configured to prevent a reaction product derived from the plasma from sticking to the sidewall; and a window device configured to lead plasma light emitted from the plasma out of the process chamber, wherein the window device comprises a window plate airtightly attached to the sidewall of the process chamber and being transmissible for the plasma light, a light guide attached to the shield member at a position between the window plate and the plasma generation space and having a number of capillary through holes configured to guide the plasma light to the window plate, the through holes having respective inner openings facing the plasma generation space and respective outer openings facing the window plate, the light guide having a resistance against the plasma higher than the window plate and being not transmissible for the plasma light except the through holes, and a cover plate attached to the shield member at a position between the window plate and the light guide and covering the outer openings of the through holes, the cover plate having a resistance against the plasma higher than the window plate and being transmissible for the plasma light.

In a third aspect, there is provided an apparatus according to the first or second aspect, wherein the cover plate consists substantially of sapphire.

In a fourth aspect, there is provided an apparatus according to the first or second aspect, wherein the cover plate has a thickness of from 0.2 to 1 mm.

In a fifth aspect, there is provided an apparatus according to the first or second aspect, wherein the cover plate is disposed in contact with the outer openings of the through holes.

In a sixth aspect, there is provided an apparatus according to the first or second aspect, wherein the cover plate is disposed separate from the outer openings of the through holes.

In a seventh aspect, there is provided an apparatus according to the first or second aspect, wherein the through holes are oriented substantially perpendicular to a surface of the window plate.

In an eighth aspect, there is provided an apparatus according to the first or second aspect, further comprising a detector disposed outside the process chamber and configured to detect a state of the plasma based on the plasma light having passed through the window plate.

In a ninth aspect, there is provided an apparatus according to the first or second aspect, wherein the exciting mechanism comprises a pair of electrodes disposed in the process chamber and configured to form an electric field in a first direction in the plasma processing space, and a magnet disposed around the process chamber and configured to form a magnetic field in a second direction perpendicular to the first direction in the plasma generation space.

BEST MODE FOR CARRYING OUT OF THE INVENTION

The embodiments of the present invention will be described hereinafter with reference to the accompanying drawings. In the following description, the constituent elements having substantially the same function and arrangement are denoted by the same reference symbols, and a repetitive description will be made only when necessary.

Figure 1:
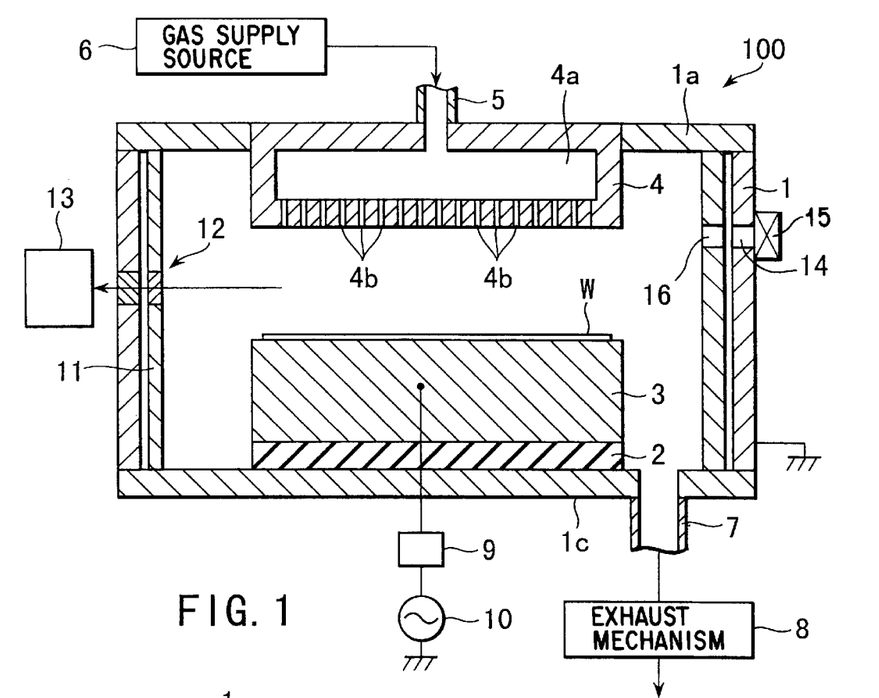
FIG. 1 is a sectional view schematically showing a plasma etching apparatus according to an embodiment of the present invention.
Figure 2:
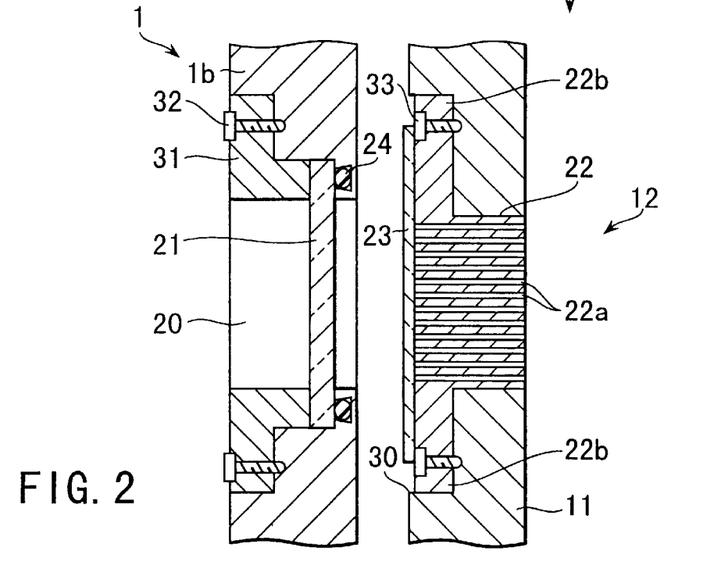
FIG. 2 is an enlarged sectional view showing a window device used in the apparatus shown in FIG. 1.

FIG. 1 is a sectional view schematically showing a plasma etching apparatus according to an embodiment of the present invention. FIG. 2 is an enlarged sectional view showing a window device used in the apparatus shown in FIG. 1.

The etching apparatus 100 includes a process chamber 1 enveloping a plasma generation space for accommodating a target substrate or semiconductor wafer W and generating plasma therein. The process chamber 1 is formed of a cylindrical body of a conductive material, such as aluminum, and has an airtight structure to keep vacuum therein. The process chamber 1 is constituted of a top wall 1a, a sidewall 1b, and a bottom wall 1c, such that the top wall 1a is detachable. In the process chamber, a substantially cylindrical susceptor 3 constituting a lower electrode is disposed on the bottom through an insulating support plate 2. On the other hand, a showerhead 4 formed of a hollow disc and constituting an upper electrode is disposed on the top wall of the process chamber 1 and faces the susceptor 3.

The susceptor 3 is made of a conductive material, such as aluminum, on the top surface of which the semiconductor wafer W to be processed is mounted. A temperature controller (not shown) is disposed in the susceptor 3, to control the semiconductor wafer W mounted on the susceptor 3 to be a predetermined temperature. An electrostatic chuck (not shown) is disposed on the mounting surface of the susceptor 3 for the semiconductor wafer W, so as for the semiconductor wafer W to be electrostatically attracted and held on the susceptor 3 in a predetermined state. Furthermore, a substantially annular focus ring (not shown) made of an insulating material is disposed on the peripheral portion of the mounting surface of the susceptor 3. The focus ring works for causing the plasma to be concentrated toward the semiconductor wafer W, so that the wafer W is subjected to a uniform plasma process.

The showerhead 4 is made of a conductive material, such as carbon or silicon. The showerhead 4 has a space portion 4a formed therein, and a number of gas delivery holes 4b formed in the bottom and communicating with the space portion 4a. Furthermore, a gas supply pipe 5 is connected to the center of the top of the space portion 4a, and is also connected to a gas supply source 6 at the other end. Accordingly, during a process, a predetermined process gas from the gas supply source 6 is sent through the gas supply pipe 5, the space portion 4a of the showerhead 4, and the gas delivery holes 4b, and is uniformly delivered toward the surface of the semiconductor wafer W on the susceptor 3.

An exhaust pipe 7 is connected to the bottom 1c of the process chamber 1, and is also connected to an exhaust mechanism 8 at the other end. The interior of the process chamber 1 is exhausted and kept at a predetermined reduced pressure, i.e., a vacuum, by the exhaust mechanism 8.

The susceptor 3 is connected to a radio frequency (RF) power supply 10 through a matching circuit 9, while the upper electrode, i.e., the showerhead 4 is grounded. During a process, a predetermined RF power is applied to the susceptor 3 from the RF power supply 10 through the matching circuit 9, so that an RF electric field having a vertical electric field direction is formed between the upper and lower electrodes, i.e., between the showerhead 4 and the susceptor 3. Consequently, the process gas supplied in the process chamber 1 is excited and turned into plasma by dissociation in the plasma generation space between the susceptor 3 and the showerhead 4. The plasma is used to subject a layer on the semiconductor wafer to a predetermined etching process.

A shield member 11, which is a cylinder having a diameter slightly smaller than that of the process chamber 1, is attached inside the sidewall 1b of the process chamber 1. The shield member 11 is detachable when the top wall 1a is removed. In other words, the shield member 11 is detachably disposed between the sidewall 1b of the process chamber 1 and the plasma generation space. The shield member 11 is used to prevent reaction products produced by the etching reaction of the process gas plasma from sticking to the inner surface of the sidewall 1b of the process chamber 1.

Those portions of the sidewall 1b of the process chamber 1 and the shield member 11 which correspond to the plasma generation space are provided with a window device 12 used for leading out plasma light emitted from the plasma, so that the state of the plasma generated in the process chamber 1 is detected. An end point detector 13 is disposed at a position outside the process chamber 1, which faces the window device 12.

The end point detector 13 includes a condensing lens, a spectroscope, an arithmetic section, and the like, to detect the end point of the plasma process. The plasma light transmitted through the window device 12 from the process chamber 1 is dispersed by the end point detector 13 to obtain emission spectra, and the end point of the etching process is decided by the arithmetic section on the basis of a change in a spectrum obtained by the dispersion.

A port 14 through which the semiconductor wafer W is transferred is formed in the sidewall 1b of the process chamber 1 and is opened/closed by a gate valve 15. An opening 16 through which the semiconductor wafer is transferred is also formed in the shield member 11 at a position corresponding to the port 14 of the sidewall 1b.

At predetermined positions of the susceptor 3, there are plurality of holes (not shown) penetrating the susceptor 3 from the upper side to the lower side, in which lifter pins (not shown) are disposed to be movable up and down. Generally, three lifter pins are arranged to correspond to the peripheral portion of the wafer. When the semiconductor wafer W is transferred into/out of the process chamber, the wafer W is moved up and down by an elevating mechanism (not shown) with the lifter pins, so that the wafer W is transferred between a transfer arm (not shown), which has entered through the port 14, and the lifter pins.

As shown in FIG. 2, the window device 12 is constituted of a window plate or first member 21, a light guide or second member 22, and a cover plate or third members 23. The first member 21 is made of quartz and is inlaid in the sidewall 1b of the process chamber 1. The second member 22 is made of aluminum with an anodized (anode-oxidation-processed) surface and is inlaid in the wall of the shield member 11 at a position corresponding to the first member 21. The third member 23 is made of single-crystalline sapphire and is in contact with and fixed onto the surface of the second member 22 on the first member 21 side.

The first member 21 has a thickness of, e.g., 8 mm, and is inlaid in a receiving opening 20 formed in the sidewall 1b of the process chamber 1, to which the first member is fixed by a pushing frame 31. An O-ring 24 is disposed between the first member 21 and the sidewall 1b to airtightly seal this portion, while the pushing plate 31 is fixed to the sidewall 1b by screws 32.

Figure 3:
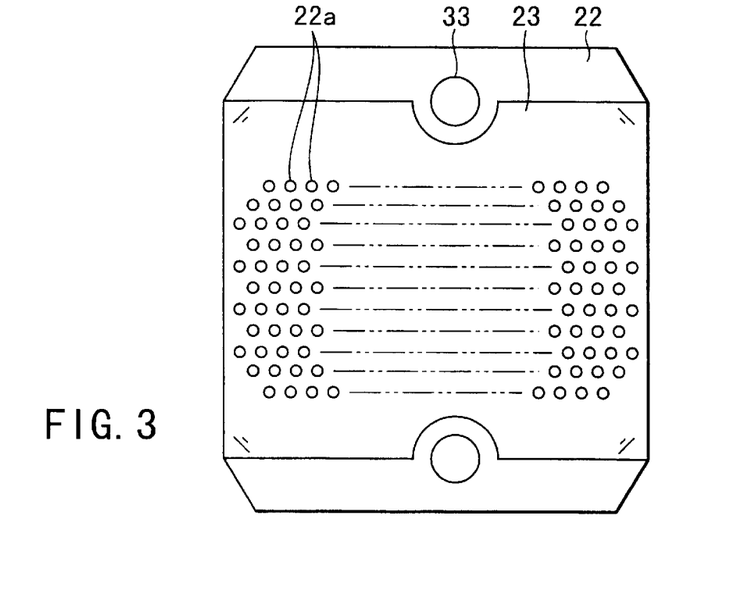
FIG. 3 is an enlarged front view showing the window device of the apparatus shown in FIG. 1.

As shown in FIG. 3 as well, the second member 22 is inlaid in a receiving opening 30, which is formed in the shield member 11 at a position corresponding to the first member 21. The second member 22 is provided with a flange 22b which is fixed to the shield member 11 by screws 33. The second member 22 has a number of capillary through holes 22a oriented in the horizontal direction to lead the plasma light from the process chamber 1 to the first member 21. In other words, the through holes 22a are oriented substantially perpendicular to the surface of the first member or window plate 21, and have respective inner openings facing the plasma generation space and respective outer openings facing the window plate or first member 21. For example, 220 through holes 22a each having a diameter of 0.8 mm are arrayed in a region of 27 mm×14 mm. The cross section of the capillary through holes 22a is not limited to a circular shape, but may be any shape corresponding to a small diameter of from about 0.2 mm to 1.5 mm.

As the diameter of the capillary through holes 22a is smaller, the aspect ratio of the capillary through holes is higher, so the amount of reaction products sticking to the cover plate 23 decreases and the present invention becomes more effective. However, the smaller diameter of the capillary through holes 22a requires a larger number of the capillary through holes to ensure a certain light quantity. In this case, the process of forming the capillary through holes is more time-consuming and more complicated. For the reasons described above, the capillary through holes 22a of this apparatus have a diameter of 0.8 mm.

The third member 23 is formed as thin as about 0.5 mm, and is in contact with and fixed to the surface of the second member 22 by appropriate fixing means, such as adhesive tapes or screws, so that it is integrated with the second member 22. In other words, the third member 23 is also in a state where it is attached to the shield member 11 by the flange 22b of the second member 22. Furthermore, the third member 23 is arranged in close contact with the outer openings of the through holes 22a of the second member 22, which face the first member 21.

Note that the first member 21 and the third member 23 are made of quartz and sapphire, respectively, which are light-transmissible and thus can transmit the plasma light. On the other hand, the second member 22 is made of aluminum, which does not transmit the plasma light.

The etching apparatus having the constitution described above is used to perform an etching process in the following sequence.

At first, a semiconductor wafer W is placed on the susceptor 3 in the process chamber 1, which is then depressurized to a predetermined pressure by the exhaust mechanism 8. Then, a predetermined process gas is supplied from the gas supply source 6 through piping lines and the process gas supply port 5, and is delivered from the gas delivery holes 4b of the showerhead 4 toward the semiconductor wafer W. At this time, an RF power with a predetermined frequency and power level is applied from the RF power supply 10 through the matching circuit 9 and the lead rod to the susceptor 3. By doing so, plasma of the process gas is excited and generated in the plasma generation space between the susceptor 3 and showerhead 4 in the process chamber 1, and is used to subject the semiconductor wafer W to a predetermined plasma process.

During the process, emission spectra of the plasma vary with the progress of etching the semiconductor wafer W. The plasma light emitted from the plasma passes through the large number of capillary through holes 22a formed in the second member of the window device 12, and is further transmitted through the third member 23 and the first member 21 to the end point detector 13. In the end point detector, the plasma light is dispersed, and the end point of the etching process is decided on the basis of a change in a spectrum obtained by the dispersion. In accordance with this decision, the etching process is caused to end.

According to this embodiment, the light guide or second member 22 is provided with the large number of capillary through holes 22a, which allows the light to pass through and prevents reaction products and the like from entering therein. The second member 22 is made of aluminum, which is not transmissible for the emission spectra of the plasma, and thus only the emission spectra having passed through capillary through holes 22a is transmitted through the third member 23 and the first member 21. Even if the reaction products stick to the surface of the second member 22, the light quantity of the emission spectra to be detected is not reduced. The second member 22 may be made of a material other than aluminum, such as a ceramic material, which is not transmissible for the emission spectra of the plasma.

Figure 4:
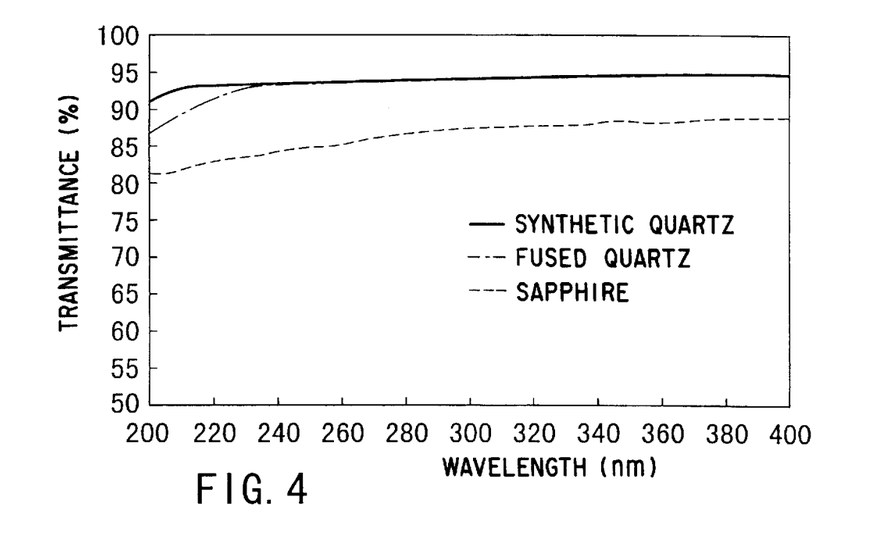
FIG. 4 is a graph showing light transmittance of quartz and sapphire.
Figure 5:
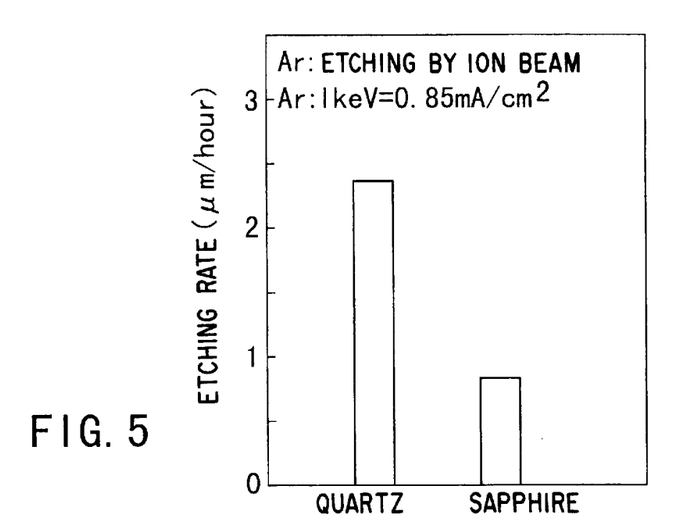
FIG. 5 is a graph showing etching resistance (i.e., plasma resistance) of quartz and sapphire in comparison with each other.

On the other hand, the third member 23 is made of single-crystalline sapphire, which has light transmittance close to that of quartz, as shown in FIG. 4, which shows data of transmittance of them having a thickness of 0.5 mm. The single-crystalline sapphire has an etching resistance (i.e., plasma resistance) three times higher than that of quartz, as shown in FIG. 5, which shows their respective etching rates when being etched by an argon ion beam. Accordingly, where the third member 23 is disposed on the surface of the second member 22, the etching caused by the plasma on the light transmissible portion is suppressed.

However, as is understood from FIG. 4, since sapphire has light transmittance lower than that of quartz, the necessary light transmittance cannot be obtained where sapphire is too thick. Accordingly, in order to maintain a desirable light transmittance, the thickness of the third member 23 should not be more than 1 mm. On the other hand, the thickness of the third member 23 should not be less than 0.2 mm, because the handling of the member becomes difficult when it is too thin.

The first member 21 is loaded with a pressure difference between the atmospheric pressure and a vacuum pressure, and thus requires a thickness of about 8 mm to have a certain strength. For this reason, if the third member is omitted and the first member 21 is made of sapphire, the light transmittance of the whole device is greatly reduced.

As described above, with this embodiment, the light transmissible portion is protected from an invasion of the reaction products and from the etching caused thereon, and thus a decrease in the light transmittance of the device caused by them is reduced. Furthermore, the second member 22 is not transmissible for the emission spectra of the plasma, and thus the light quantity of the emission spectra to be detected is not reduced even if the reaction products and the like stick to the second member 22. As a result, it is possible to precisely detect the state of the plasma for a long period of time, thereby precisely deciding the end point of the etching process.

The third member 23 is disposed as a light transmissible portion on the inner side of the third member 23, and only the third member 23 needs to be replaced with a new one when the light transmittance is lowered. In other words, the frequency of replacement of the first member 21 can be very low.

The second member 22 and the third member 23 closely fixed thereon are disposed on the detachable shield member 11, and thus the second and third members 22 and 23 are removed along with the shield member 11 from the process chamber 1. Accordingly, the replacing operation of the second and third members 22 and 23 exposed to the plasma is very easy.

Figure 6:
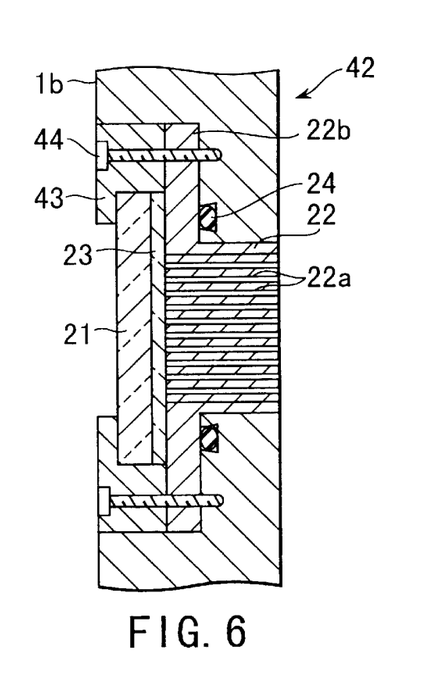
FIG. 6 is a sectional view showing a window device according to another embodiment of the present invention.

FIG. 6 is a sectional view showing a window device according to another embodiment of the present invention.

In the window device 42 shown in FIG. 6, a light guide or second member 22 is attached not to a shield member 11 but to the sidewall 1b of a process chamber 1. A cover plate or third member 23 is in contact with and fixed onto the outer surface of the second member 22, and a window plate or first member 21 is in contact with and fixed to the outer surface of the third member 23. The first member 21 is pressed against the sidewall 1b by a pushing frame 43, and the pushing frame 43 and the flange 22b of the second member is fixed to the sidewall 1b by screws 44. An O-ring 24 is disposed between the flange 22b of the second member 22 and the sidewall 1b to airtightly seal this portion.

Where the detection window 42 is thus constituted of the first, second, and third members 21, 22, and 23, which are closely disposed one on the other, the light transmissible portion is also protected from an invasion of the reaction products and from the etching caused thereon, and thus a decrease in the light transmittance of the device caused by them is reduced. Furthermore, the second member 22 is not transmissible for the emission spectra of the plasma, and thus the light quantity of the emission spectra to be detected is not reduced even if the reaction products and the like stick to the second member 22. As a result, it is possible to precisely detect the state of the plasma for a long period of time, thereby precisely deciding the end point of the etching process.

Figure 7:
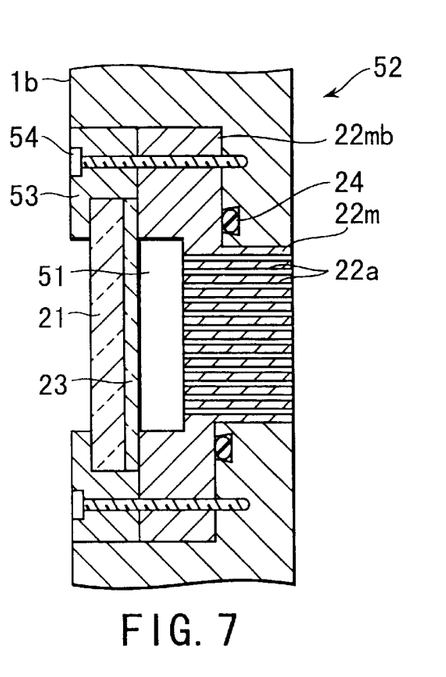
FIG. 7 is a sectional view showing a window device according to still another embodiment of the present invention.

FIG. 7 is a sectional view showing a window device according to still another embodiment of the present invention.

Also in the window device 52 shown in FIG. 7, a light guide or second member 22m is attached not to a shield member 11 but to the sidewall b of a process chamber 1. The second member 22m has a flange 22mb extending in the thickness direction to form a space between the second and third members 22m and 23. With the flange 22mb, the third member 23 is disposed to be separated from the outer openings of through holes 22a formed in the second member 22m, which face a first member 21. A first member 21 is in contact with and fixed onto the outer surface of the third member 23. The first member 21 is pressed against the sidewall 1b by a pushing frame 53, and the pushing frame 53 and the flange 22mb of the second member is fixed to the sidewall 1b by screws 54. An O-ring 24 is disposed between the flange 22mb of the second member 22m and the sidewall 1b to airtightly seal this portion.

Where the detection window 52 is thus constituted of the second and third member 22m and 23 separated from each other, the amount of the reaction products and the like sticking to the third member 23 is reduced, even if the reaction products enter from the through holes 22a of the second member 22m.

Figure 8:
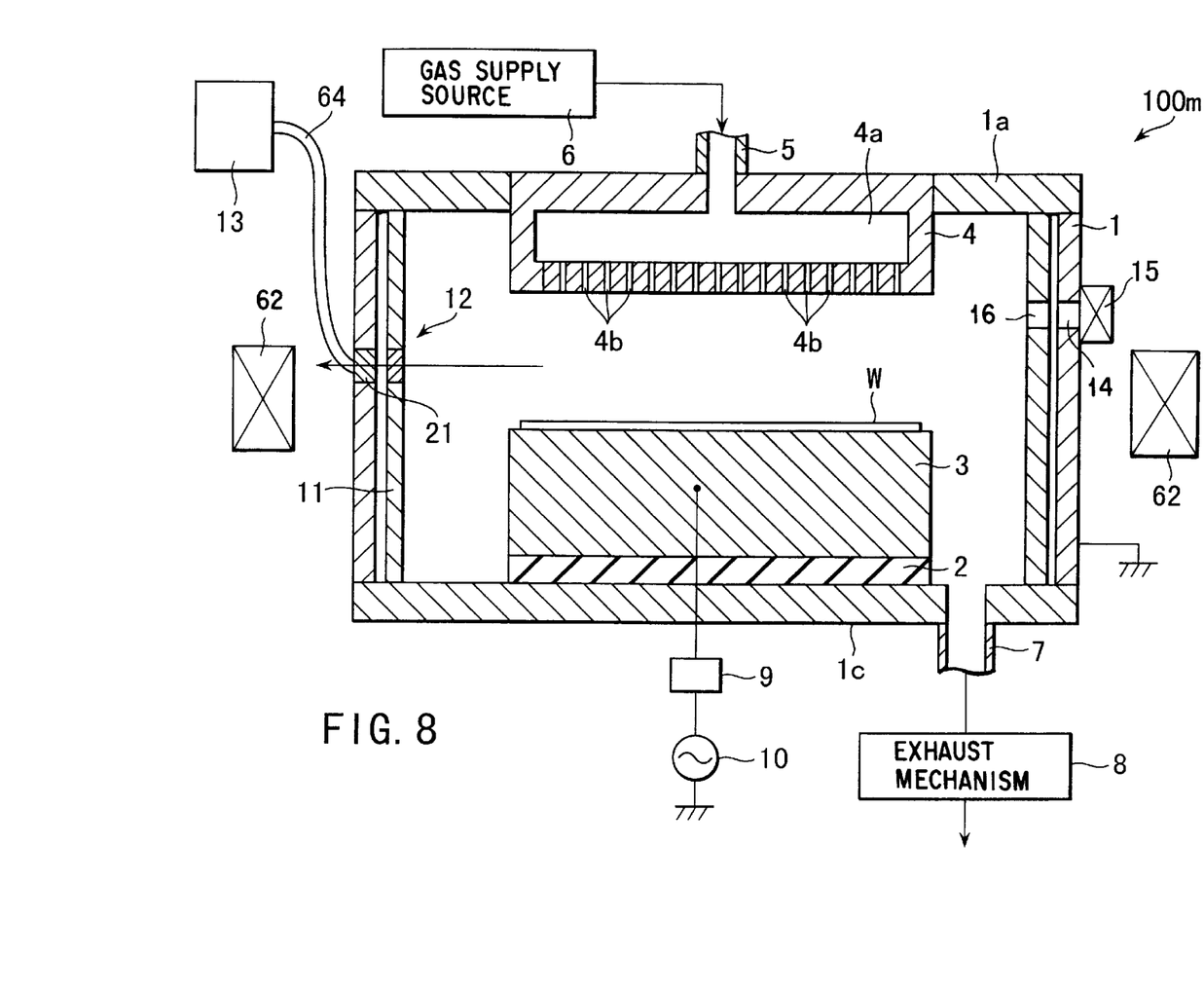
FIG. 8 is a sectional view schematically showing a plasma etching apparatus according to still another embodiment of the present invention.

FIG. 8 is a sectional view schematically showing a plasma etching apparatus according to still another embodiment of the present invention.

The etching apparatus 100m shown in FIG. 8 differs from the etching apparatus 100 shown in FIG. 1, in that it has a dipole ring magnet, which is disposed around the sidewall 1b of a process chamber 1 and is rotatable. The dipole ring magnet 62 forms a rotational magnetic field having a magnetic field direction parallel to a semiconductor wafer, i.e., in the horizontal direction, between upper and lower electrodes in the process chamber 1, i.e., in a plasma generation space between a susceptor 3 and a showerhead 4. As described previously, an RF electric field having a vertical electric field direction is formed between the susceptor 3 and the showerhead 4. With this arrangement of the etching apparatus 100m, the drifting movement of electrons is caused by the cooperation of the magnetic field and the electric field perpendicular to each other, so that the etching process is performed with a high efficiency. An end point detector 13 is connected to the window plate or first member 21 of a window device 12 by an optical fiber 64.

In the structure of the etching apparatus shown in FIG. 8, since the dipole ring magnet 62 is disposed near the window device 12, it may be inconvenient to remove second and third members 22 and 23 of the window device 12 out of the sidewall 1b of the process chamber 1. Similar problems may be also caused when various kinds of equipment units exist around the sidewall 1b of the process chamber 1. For this reason, as described above, where the second and third members 22 and 23 exposed to the plasma are disposed on a detachable shield member 11, the replacing operation of the second and third members 22 and 23 can be performed very easily without interfering with the equipment units around the sidewall 1b of the process chamber 1.

Although some preferable embodiments according to the present invention have been explained, the present invention is not limited to the above described embodiments, but may be modified in various ways. For example, in the embodiments, the light guide or second member is made of aluminum, but this member is not limited to this material. It suffices that the light guide at least has a surface which is not transmissible for the emission spectra of the plasma. For example, the light guide may be formed of a ceramic or a light transmissible material with a surface coated with a material which is not light transmissible. Also, the first and third members may be formed of a light transmissible material other than quartz and sapphire.

Furthermore, in the embodiments, the window device is used for detecting the end point of the plasma, but the device may be used for detecting the state of plasma for another purpose. The position of the window device is not limited to the position adopted in the embodiments, so long as it can be used for detecting the state of the plasma. A plurality of window devices may be disposed in place of the single window device.

Furthermore, in the embodiments, an etching process is described as an example of a plasma process, but the present invention may be applied to another plasma process, such as plasma CVD (film forming process). Also, in the embodiments, a semiconductor wafer is described as an example of a target substrate, but the present invention may be applied to another target substrate, such as a glass substrate for a liquid crystal display device (LCD).

What is claimed is:

1. A plasma processing apparatus for a semiconductor processing system, comprising:
   a process chamber enveloping a plasma generation space for generating plasma;
   an exhaust mechanism configured to exhaust the process chamber and set the process chamber at a vacuum;
   a process gas supply mechanism configured to supply a process gas into the process chamber;
   an exciting mechanism configured to excite the process gas and turn the gas into plasma in the plasma generation space;
   a shield member detachably disposed between a sidewall of the process chamber and the plasma generation space, and configured to prevent a reaction product derived from the plasma from sticking to the sidewall; and
   a window device configured to lead plasma light emitted from the plasma out of the process chamber,
   wherein the window device comprises
      a window plate airtightly attached to the sidewall of the process chamber and consisting essentially of a material transmissible for the plasma light,
      a light guide attached to the shield member at a position between the window plate and the plasma generation space and having a number of capillary through holes configured to guide the plasma light to the window plate, the through holes having respective inner openings facing and exposed to the plasma generation space and respective outer openings facing the window plate, the light guide consisting essentially of a material having a resistance against the plasma higher than the window plate and being not transmissible for the plasma light except the through holes, and
      a cover plate attached to the shield member at a position between the window plate and the light guide and covering the outer openings of the through holes, the cover plate consisting essentially of a material having a resistance against the plasma higher than the window plate and being transmissible for the plasma light with transmissivity relative to the plasma light lower than that of the window plate, and the cover plate being thinner than the window plate and supported by the light guide in a state where the cover plate is in contact with and fixed onto a surface of the light guide.

2. The apparatus according to claim 1, wherein the cover plate consists substantially of sapphire.

3. The apparatus according to claim 2, wherein the cover plate has a thickness of from 0.2 to 1 mm.

4. The apparatus according to claim 2, wherein the window plate consists essentially of quartz.

5. The apparatus according to claim 2, wherein the cover plate consists essentially of single-crystalline sapphire.

6. The apparatus according to claim 1, wherein the through holes are oriented substantially perpendicular to a surface of the window plate.

7. The apparatus according to claim 1, further comprising a detector disposed outside the process chamber and configured to detect a state of the plasma based on the plasma light having passed through the window plate.

8. The apparatus according to claim 1, wherein the exciting mechanism comprises a pair of electrodes disposed in the process chamber and configured to form an electric field in a first direction in the plasma processing space, and a magnet disposed around the process chamber and configured to form a magnetic field in a second direction perpendicular to the first direction in the plasma generation space.

9. The apparatus according to claim 1, wherein the through holes have a diameter of 0.2 to 1.5 mm.

10. The apparatus according to claim 1, wherein the light guide consists essentially of aluminum or a ceramic material.

11. A plasma processing apparatus for a semiconductor processing system, comprising:
- a process chamber enveloping a plasma generation space for generating plasma;
- an exhaust mechanism configured to exhaust the process chamber and set the process chamber at a vacuum;
- a process gas supply mechanism configured to supply a process gas into the process chamber;
- an exciting mechanism configured to excite the process gas and turn the gas into plasma in the plasma generation space;
- a shield member detachably disposed between a sidewall of the process chamber and the plasma generation space, and configured to prevent a reaction product derived from the plasma from sticking to the sidewall; and
- a window device configured to lead plasma light emitted from the plasma out of the process chamber, wherein the device comprises
- a window plate airtightly attached to the sidewall of the process chamber and consisting essentially of a material transmissible for the plasma light,
- a light guide attached to the shield member at a position between the window plate and the plasma generation space and having a number of capillary through holes configured to guide the plasma light to the window plate, the through holes having respective inner openings facing and exposed to the plasma generation space and respective outer openings facing the window plate, the light guide consisting essentially of a material having a resistance against the plasma higher than the window plate and being not transmissible for the plasma light except the through holes, and the through holes having a diameter of 0.2 to 1.5 mm and being oriented substantially perpendicular to a surface of the window plate, and
- a cover plate attached to the shield member at a position between the window plate and the light guide and covering the outer openings of the through holes, the cover plate consisting essentially of a material having a resistance against the plasma higher than the window plate and being transmissible for the plasma light and cover plate is in contact with and fixed onto a surface of the light guide.

12. The apparatus according to claim 11, wherein the light guide consists essentially of aluminum or a ceramic material.

13. The apparatus according to claim 11, wherein the light guide comprises a first portion in which the through holes are formed, and a flange integrally formed with the first portion and extending laterally from the first portion, the first portion being fitted in a corresponding opening formed in the shield member, while the flange being fitted in a recess formed in the shield member adjacent to the corresponding opening.

14. The apparatus according to claim 11, wherein the cover plate is supported by the light guide in a state where the cover plate is in contact with and fixed onto a surface of the light guide.

15. The apparatus according to claim 11, further comprising a detector disposed outside the process chamber and configured to detect a state of the plasma based on the plasma light having passed through the window plate.

* * * * *